United States Patent
Scatchard et al.

(10) Patent No.: US 8,843,870 B2
(45) Date of Patent: Sep. 23, 2014

(54) METHOD OF REDUCING CURRENT LEAKAGE IN A DEVICE AND A DEVICE THEREBY FORMED

(75) Inventors: Bruce Scatchard, Anmore (CA); Chunfang Xie, Coquitlam (CA); Scott Barrick, Surrey (CA); Kenneth D. Wagner, West Vancouver (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/535,835

(22) Filed: Jun. 28, 2012

(65) Prior Publication Data

US 2014/0001601 A1    Jan. 2, 2014

(51) Int. Cl.
*G06F 17/50*    (2006.01)

(52) U.S. Cl.
USPC ........... 716/132; 716/108; 716/109; 716/113; 716/114; 716/115; 716/133; 716/134; 716/135; 716/136; 716/139

(58) Field of Classification Search
USPC ......... 716/108–109, 113–115, 132–136, 139; 326/93–98
See application file for complete search history.

(56) References Cited

U.S. PATENT DOCUMENTS

| | | | |
|---|---|---|---|
| 6,928,635 B2 * | 8/2005 | Pramanik et al. | 716/53 |
| 7,441,211 B1 | 10/2008 | Gupta et al. | |
| 7,567,478 B2 * | 7/2009 | Brown | 365/227 |
| 2011/0156167 A1 | 6/2011 | Kornachuk | |

OTHER PUBLICATIONS

Fallah et al., Standby and Active Leakage Current Control and Minimization in CMOS VLSI Circuit, 2004, IEEE, pp. 1-21.*

* cited by examiner

*Primary Examiner* — Nghia Doan
(74) *Attorney, Agent, or Firm* — Dennis R. Haszko

(57) ABSTRACT

A method of reducing current leakage in unused circuits performed during semiconductor fabrication and a semiconductor device or integrated circuit thereby formed. The method involves modifying a characteristic of at least one idle circuit that is unused in a product variant, to inhibit the circuit and reduce current leakage therefrom upon powering as well as during operation. The method can substantially increase the $V_t$ (threshold voltage) of all transistors of a given type, such as all N-type transistors or all P-type transistors. The method is also suitable for controlling other transistor parameters, such as transistor channel length, as well as other active elements, such as N-type resistors or P-type resistors, in unused circuits which affect leakage current as well as for other unused circuits, such as a high $V_t$ circuit, a standard $V_t$ circuit, a low $V_t$ circuit, and an SRAM cell $V_t$ circuit.

21 Claims, 9 Drawing Sheets

| Devices | Mask | Low VT | | Std. VT | | High VT | | SRAM Cell | | |
|---|---|---|---|---|---|---|---|---|---|---|
| | | NMOS | PMOS | NMOS | PMOS | NMOS | PMOS | PD | PG | PU |
| HVT-N | 1-N | 0 | 0 | 0 | 0 | 1 | 0 | 1 | 1 | 0 |
| LVT-N | 2-N | 0 | 0 | 1 | 0 | 1 | 0 | 0 | 0 | 0 |
| SVT-N | 3-N | 1 | 0 | 1 | 0 | 1 | 0 | 0 | 0 | 0 |
| N-Cell | 4-N | 0 | 0 | 1 | 0 | 0 | 1 | 1 | 1 | 0 |
| Addition NMOS | PMC_N | 1 | 0 | 1 | 0 | 1 | 0 | 1 | 1 | 0 |
| HVT-P | 1-P | 0 | 0 | 0 | 1 | 0 | 1 | 0 | 0 | 0 |
| LVT-P | 2-P | 0 | 0 | 0 | 1 | 0 | 1 | 0 | 0 | 0 |
| SVT-P | 3-P | 0 | 1 | 0 | 1 | 0 | 1 | 0 | 0 | 1 |
| P-Cell | 4-P | 0 | 1 | 0 | 1 | 0 | 0 | 0 | 0 | 1 |
| Addition PMOS | PMC_P | 0 | 1 | 0 | 1 | 0 | 1 | 0 | 0 | 1 |

Note: "1" refers to mask open, with IMP dosage

FIG. 2

| NMOS | | Vt increase ratio | PMOS | | Vt increase ratio | Ioff reduction ratio at Thermal |
|---|---|---|---|---|---|---|
| UHVtn1 | Vtl | 1.340 | UHVtp1 | Vtl | 1.200 | 0.11 |
| UHVtn2 | Vtl | 1.170 | UHVtp2 | Vtl | 1.100 | |
| UHVtn3 | Vtl | 1.340 | UHVtp3 | Vtl | 1.200 | 0.33 |
| Hvt NMOS | Vtl | 1.350 | Hvt PMOS | Vtl | 1.221 | 1.00 |
| Svt NMOS | Vtl | 1.339 | Svt PMOS | Vtl | 1.171 | 3 |
| Lvt NMOS | Vtl | 1.000 | Lvt PMOS | Vtl | 1.000 | 9 |
| Notes: | Ioff reduction ratio is repect to Lvt transistors. | | | | | |

| Devices | Mask | Low VT | | Std VT | | High VT | | SRAM Cell | | | Resistor | |
|---|---|---|---|---|---|---|---|---|---|---|---|---|
| | | NMOS | PMOS | NMOS | PMOS | NMOS | PMOS | PD | PG | PU | N-type | P-type |
| HVT-N | 1-N | 0 | 0 | 0 | 0 | 1 | 0 | 0 | 0 | 0 | 0 | 0 |
| LVT-N | 2-N | 1 | 0 | 0 | 0 | 0 | 0 | 0 | 0 | 0 | 0 | 0 |
| SVT-N | 3N | 0 | 0 | 1 | 0 | 0 | 0 | 1 | 0 | 0 | 1 | 0 |
| N-Resistor block | R-N | 0 | 0 | 0 | 0 | 0 | 0 | 0 | 0 | 0 | 1 | 0 |
| N-Cell | 4-N | 0 | 0 | 0 | 0 | 0 | 0 | 0 | 1 | 0 | 0 | 0 |
| Addition NMOS | PMC_N | 1 | 0 | 1 | 0 | 1 | 0 | 1 | 1 | 0 | 1 | 0 |
| HVT-P | 1-P | 0 | 0 | 0 | 0 | 0 | 1 | 0 | 0 | 0 | 0 | 0 |
| LVT-P | 2-P | 0 | 1 | 0 | 0 | 0 | 0 | 0 | 0 | 0 | 0 | 0 |
| SVT-P | 3P | 0 | 0 | 0 | 1 | 0 | 0 | 0 | 0 | 0 | 0 | 0 |
| P-Resistor block | R-P | 0 | 0 | 0 | 0 | 0 | 0 | 0 | 0 | 1 | 0 | 0 |
| P-Cell | 4-P | 0 | 0 | 0 | 0 | 0 | 0 | 0 | 0 | 1 | 0 | 0 |
| Addition PMOS | PMC_P | 0 | 1 | 0 | 1 | 0 | 1 | 0 | 0 | 1 | 0 | 1 |

Note: "1" refers to mask open, with IMP dosage or block the salicidation

FIG. 4

METHOD OF REDUCING CURRENT LEAKAGE IN A DEVICE AND A DEVICE THEREBY FORMED

TECHNICAL FIELD

This disclosure relates to electronic devices, such as semiconductor devices and integrated circuit (ICs). Specifically, this disclosure relates to reducing current leakage in electronic devices such as semiconductor devices and ICs.

BACKGROUND

Current related art techniques for power leakage reduction include multiple voltage threshold (multi-$V_t$) bias techniques. Such techniques are generally applied during the design process.

In order to save design cost and time to market, semiconductor designers typically use only one platform design to satisfy the feature and performance requirements of many related product applications; in this way, the cost of product development is amortized over many design opportunities. However, this related art approach for accommodating any given customer's intended use or product application results in unwanted power consumption in idle circuits, because the current leakage is a significant part of the total power dissipation.

It is desirable to provide a power leakage reduction technique that addresses the problem of power reduction for a plurality of product variants after the device has been designed.

BRIEF DESCRIPTION OF THE DRAWINGS

For a better understanding of the present disclosure, reference is made to the below-referenced accompanying drawings. Reference numbers refer to the same or equivalent parts of the present disclosure throughout the several figures of the drawings.

FIG. 2 is a table, showing a mask "truth" table for fabricating an approximately 40-nm semiconductor device, by example only, according to an embodiment of the present disclosure.

FIG. 4 is a table, showing a mask truth table for fabricating a semiconductor device having other elements, by example only, according to an embodiment of the present disclosure.

DETAILED DESCRIPTION

Figure 1:
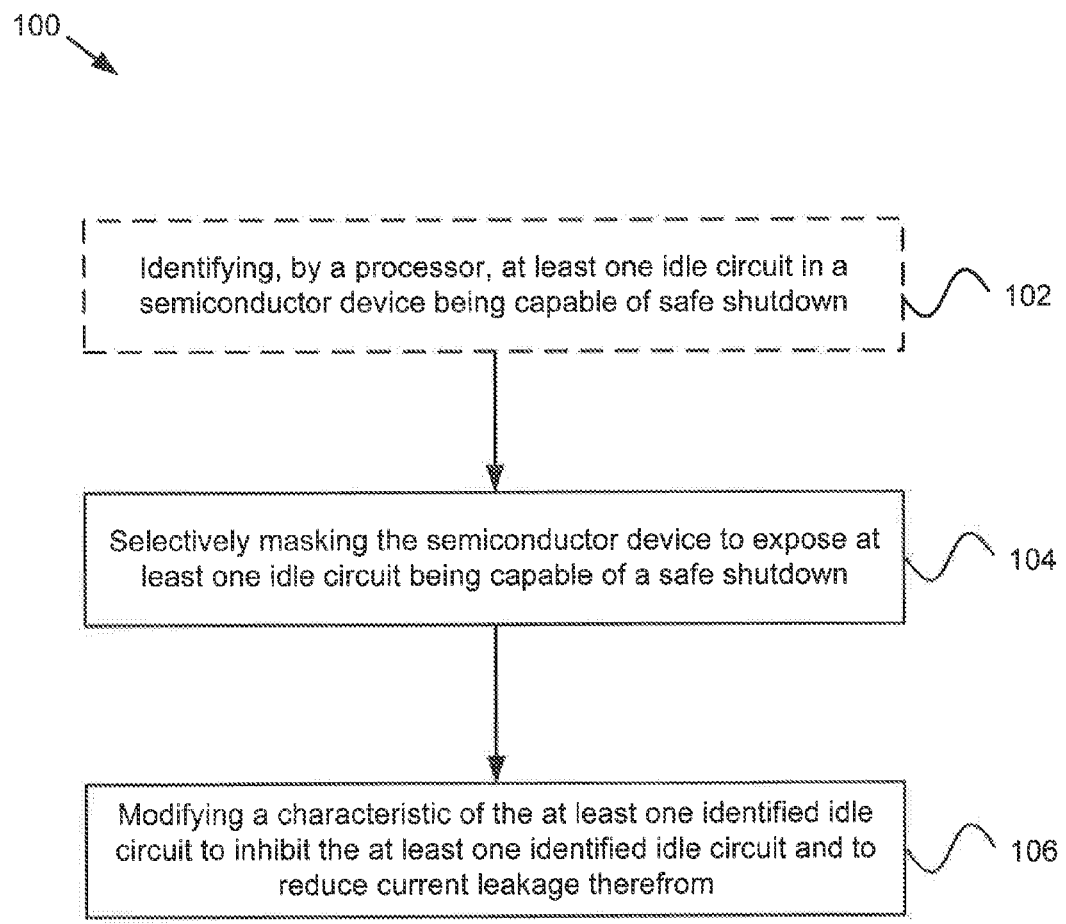
FIG. 1 is a flowchart, showing a method of reducing current leakage in at least one idle circuit of a device, such a semiconductor device, by example only, according to the present disclosure.

The present disclosure describes some solutions to the problem of power reduction for a plurality of product variants after the device has already been designed. For example, this disclosure relates to techniques for reducing current leakage in electronic devices, such as semiconductor devices and ICs, during fabrication. In an embodiment, the present disclosure involves a method of reducing current leakage during wafer processing using various techniques and a device thereby formed.

In an embodiment, the present disclosure provides a method of reducing current leakage in unused circuits performed during semiconductor fabrication and a semiconductor device thereby formed. The method involves using a semiconductor process technique for reducing current leakage in semiconductor product variants having unused circuits. A semiconductor device or integrated circuit fabricated by this method has reduced current leakage upon powering as well as during operation. In an embodiment, the method involves semiconductor process technique that substantially increases the $V_t$ (threshold voltage) of all transistors of a given type, such as all N-type transistors or all P-type transistors. The semiconductor process technique is also suitable for controlling other transistor parameters, such as transistor channel length, as well as other active elements, such as N-type resistors or P-type resistors, in unused circuits which affect leakage current as well as for unused circuits having previously applied semiconductor process techniques, such as a high $V_t$ circuit, a standard $V_t$ circuit, a low $V_t$ circuit, and an SRAM cell $V_t$ circuit.

In wafer processing, product variants tend to share the same die; however, some functional blocks are not required to be active in some variants. In order to save cost and time to market, chip foundries desire to use the same design, e.g., the same mask set, for fabricating all product variants. Power consumption associated with unused functional blocks, also known as idle circuits, is a concern in that, while still being powered, these unused functional blocks dissipate static power in the form of current leakage. In the present disclosure, an idle circuit is an unused circuit that is not only idle, but also not intended to be used at all in a given product variant, such that it can be shut down or disabled without consequence. For example, an idle circuit is identified as not necessary for correct functional operation of a product variant.

According to embodiments of the present disclosure, significantly reducing the current leakage of these unused functional blocks can provide a competitive market advantage for all variant chips which share the same die. For example, the present disclosure describes a method of reducing current, which determines power, on some of the non-used paths. The method can include increasing the capacitance or the resistance of specific elements, such as increasing varactor capacitance or resistor values.

A method according to an embodiment of the present disclosure reduces design cost and time to market for new semiconductor products by efficiently generating one or more product variants and reducing or eliminating the need for expensive approaches relating to area and timing, such as power-gating, in an attempt to reduce static power dissipation. Devices formed by a method of the present disclosure have significantly reduced current leakage.

Features of the present disclosure include, but are not limited to, a significant reduction of the thermal current leakage. In an example embodiment, thermal leakage current reduction is in a range of approximately 80% to approximately 90% in the unused or idle circuits. Such significant thermal current leakage reduction is especially useful for product variants, wherein large blocks of logic are unused. Embodiments of the present disclosure reduce and preferably eliminate a need for any major product design changes, since the method and device involve only a marker layer for tagging the identified circuits. Embodiments of the present disclosure allow slow continued operation of the affected circuits, without compromising the design for test (DFT).

Embodiments of the present disclosure also provide one or more of the following: prevents floating node generation, since the method and device do not generate undriven outputs; minimizes mask costs; and increases efficiency in current leakage reduction for an existing chip design, by using one platform configuration that is applicable for a plurality of product variants. Embodiments described herein also provide amortization of development costs over many chip design opportunities, decrease overall power consumption of the device, and address adverse effects of unused features and circuits from customer to customer.

The disclosed method also applies to ICs, such as chips with a field-programmable gate array (FPGA), as well as to all types of transistors in a single functional circuit block, such as ultra-high threshold voltage (UHVT) devices, high threshold voltage (HVT) devices, low threshold voltage (LVT) devices, ultra-low threshold voltage (ULVT) devices, standard threshold voltage (SVT) devices, static random access memory (SRAM) devices, and cell VT devices. Further, the method is compatible use with poly-masking or poly-resistor masking for providing the highest channel bias, IC devices formed by the disclosed method experience increased power savings without impacting overall product performance. Even further, the disclosed method preserves testability of a semiconductor device by allowing use of the same vectors.

FIG. 1 is a flowchart illustrating a method 100 of reducing current leakage, according to an embodiment of the present disclosure. The method 100 of reducing current leakage in an electronic device, for example a semiconductor device, comprises: identifying, for example by a processor, at least one idle circuit in a semiconductor device, thereby providing at least one identified idle circuit, as indicated in optional block 102; selectively masking the device to expose the at least one identified idle circuit, as indicated in block 104; and modifying a characteristic of the at least one identified idle circuit, thereby inhibiting the at least one identified idle circuit and reducing current leakage therefrom, as indicated by block 106.

In an embodiment, optional block 102 is omitted from the method, such that the method includes blocks 104 and 106. In such an embodiment, the actions associated with block 102 may be performed ahead of time, by another entity, and the identification of the idle circuits is provided as an input to block 104.

In an example embodiment, the at least one idle circuit comprises a plurality of idle circuits each having the same device type, such as P-type or N-type. In this example embodiment, block 104 of selectively masking the semiconductor device comprises masking the plurality of idle circuits of the same device type with an idle circuit mask distinctive to the device type.

Selectively masking the device to expose the identified idle circuits can include using a mask that is distinctive in relation to one, or each, device-type within a given identified idle circuit, e.g., an N-MOS device and a P-MOS device. Since both N-type and P-type devices may occur in a given circuit, both types of corresponding masking may be used in the disclosed method. For example, poly-resistors are adjustable and may be used for selective masking. Where applicable in other embodiments, a single mask type can also be used for reducing fabrication costs. The disclosed selective masking may be used for both digital and analog devices.

In another example embodiment, the at least one idle circuit comprises a first set of idle circuits of a first device type and a second set of idle circuits of a second device type. In that example embodiment, block 104 of selectively masking comprises: masking the first set of idle circuits with a first idle circuit mask; and masking the second set of idle circuits with a second idle circuit mask, the first and second idle circuit masks being distinctive to the first and second device type, respectively.

In an example embodiment, block 104 of selectively masking the semiconductor device comprises selectively masking a plurality of analog circuits, a plurality of digital circuits, or both.

In an embodiment, block 106 of modifying the characteristic of the at least one identified idle circuit comprises modifying an electrical characteristic or a physical characteristic, or both, of the circuit, resulting in the at least one identified idle circuit having modified electrical properties. Modifying the characteristic of the circuit can comprise applying a semiconductor process technique to the circuit.

In an example embodiment, block 106 of modifying the characteristic of the at least one idle circuit comprises implanting a dopant. In an example embodiment, implanting the dopant comprises implanting at least one custom dopant, for example at least one of: a voltage threshold (Vt) implant, a pocket implant, a lightly doped drain (LDD) implant, and a source and drain implant. In each of these examples, modifying can comprise increasing the characteristic.

In an example embodiment, block 106 of modifying the characteristic of the at least one idle circuit comprises at least one of: modifying a gate dielectric thickness; modifying a gate length; modifying a poly critical dimension (CD); modifying a gate spacer dimension; and modifying a FinFET fin width.

In an example embodiment in which the step in block 102 is performed, identifying comprises identifying the at least one idle circuit based on a set of timing constraints corresponding to a product variant.

In another example embodiment, identifying in block 102 comprises applying a subtractive idle circuit identification. In an example embodiment, the idle circuit identification includes listing all circuits, such as gates, in a product netlist, by using available data which, for example, is extractable from a database or a spreadsheet and analyzing static timing (performing static timing analysis "STA") of all circuits by using a given set of timing constraints for a target product variant.

STA is an exhaustive process used in the disclosed method for ensuring that the performance requirements of synchronous digital circuits in the product and the product variants are met under all manufacturing conditions. STA can be implemented by way of CAD tools, by example only, and use information regarding the existence of timing models relating to the circuit types that are integrated into a given product. For instance, the timing models can specify the interconnect delay, the slew, and other characteristics of each circuit type. By combining these timing models with information regarding the interconnect delays, an STA tool, such as a CAD tool, can evaluate the fastest paths and the slowest paths in a device. Timing constraint information that is input to the STA tool is compared with this interconnect delay information to ensure that all product performance goals are satisfied, without exception.

In an example embodiment, block 102 can further comprise: analyzing static timing of all circuits defined by a target product variant for determining a first circuit list including at least one timing-constrained circuit having a timing-constrained path; generating a second circuit list of at least one non-timing-constrained circuit by omitting circuits in the first circuit list from a list of all circuits; and identifying, in the second circuit list, the at least one idle circuit in the device by omitting, from the second circuit list, circuits for remaining in operation in the product variant. The timing-constrained paths can be specified in Synopsys Design Constraint (SDC) format. The at least one idle circuit is identified as not necessary for correct functional operation of the product variant, and identified from the second list after those circuits that should remain in operation have been omitted.

In an example embodiment, the step of analyzing can comprise scanning the at least one timing-constrained circuit with a DC scanning technique. In another example embodiment, the step of analyzing comprises analyzing static timing of all circuits defined by the target product variant by using a set of timing constraints for the target product variant, thereby providing static timing circuit data including data relating to the at least one timing-constrained circuit.

In an example embodiment, the method further comprises: reanalyzing static timing of all circuits; and performing at least one of a circuit level simulation and a gate level timing simulation for confirming that the device fabricated, using the target product variant, is fully functional. The method can also further include reanalyzing the static timing of all the remaining non-idle circuits, rerunning "sign-off" STA, and performing any necessary circuit level or gate level timing simulation to ensure that the product variant is fully functional.

Testing the product circuits can involve scanning the circuits with a slow-speed scan, a DC test technique, such as a DC scan and/or a DC random access memory built-in self-test (RAM BIST). All automatic test pattern generation (ATPG) vectors, resulting from use of these slow-speed scan techniques, should continue to function properly on a product variant after the method has been applied. Testing the timing of all the circuits optionally involves scanning the circuits with a path timing, an AC test technique such an AC scan and/or at-speed RAM BIST. Eliminating parts based on testing of any idle circuits on a product variant poses a risk of yield loss or parts failure and would not further adversely affect operation of the product variant.

In an example embodiment, identifying in block 102 includes applying a marker layer for tagging the at least one identified idle circuit.

In an example embodiment, the method 100 further comprises verifying a new product variant configuration, including preparing a new set of timing models for all types of circuits that are identified as idle circuits. The method includes providing timing models for the idle circuits that are setting very large propagation and transition delays in the cells to ensure that they would fail static timing if found on a functional (timing-constrained) path during static timing. The timing models can be in Liberty format, such format being compatible with, or identical to, the corresponding reference timing models.

In some cases, certain circuits should or must remain operational, such as clock tree gates. These circuits that are desired to remain operational can be described as exception circuits. In another example embodiment, the method 100 further comprises: selecting an exception circuit from the at least one identified idle circuit; and maintaining power to the exception circuit, providing the exception circuit with a minimized current leakage, and rendering the exception circuit operable at a minimized speed. For example, an exception circuit is an initially selected identified idle circuit that is deemed to be excluded from the initially selected identified idle circuits for any other reason or criterion hitherto unaccounted in the initial selection.

According to other embodiments, the present disclosure provides a non-transitory computer-readable medium for storing statements and instructions, executable by a processor, and adapted to perform a method of reducing current leakage in a semiconductor device, according to the various embodiments as described in detail above and herein.

Referring to FIG. 2, this table 110 illustrates a detailed example of transistor leakage and threshold voltage estimations using the method 100, according to another embodiment of the present disclosure. In this example, a production control unit can order a new product variant, having identical processes and masks 112 as those of the original product variant, with the addition of modified implant process masks 114 and 116. In the example embodiment of FIG. 2, first and second masks 114 and 116, identified as PMC-N and PMC-P implants, are added to inhibit the N-type and P-type idle circuits, respectively.

Figure 3:
FIG. 3 is a table, showing data for estimating transistor leakage and threshold voltages, by example only, according to an embodiment of the present disclosure.

Referring to FIG. 3, this table 120 illustrates a detailed example of leakage reduction estimations using the method 100, using an ultra-high threshold voltage (UHVt) target, according to an embodiment of the present disclosure. By example only, a custom implant $V_t$ target for a 40-nm structure can be twice (2×) that of HVt, wherein the estimated leakage will be reduced to less than one ninth (1/9). In this example, an SRAM element or device can also be selected as an idle circuit if needed.

Referring to FIG. 4, this table 130 illustrates a detailed example of using a mask logic operation using the method 100 to generate a new or custom implant mask, according to another embodiment of the present disclosure. While the foregoing examples have involved the use of transistors, instead, using the same general approach of method 100 with a varactor, a resistor value, and varactor gate leakages is also within the scope of the present disclosure. Use of the presently disclosed method 100 for varactors, resistor values, and de-capacitance of a capacitor's gate leakage is also beneficial for other product variants.

With respect to an example embodiment in relation to FIG. 4, the present method 100 also includes or encompasses replacing a varactor with a "de-cap" capacitor value, replacing a diffusion or a poly resistor value with a fabrication technique defining new values, and reducing varactor gate leakages. In an example embodiment, these steps are all performed while creating a custom implant to increase transistor threshold voltage. By using the present method 100 in conjunction with varactors, resistors, and other possible elements, the reduction of gate leakage or overall path current is enhanced with only some minor modifications in mask generation.

For example, in relation to FIG. 4, two additional masks, e.g., of one technology, are generated. The first mask 114 may be designated as a PMC-N mask for use with all NMOS and N-type elements, e.g., respectively, NMOS (HVt, LVt, SVt, SRAM, cell PD, PG) and N-type elements (NMOS varactor, N-type resistors). The second mask 116 may be designated as a PMC-P mask for use with all PMOS and P-type elements, e.g., respectively, PMOS (HVt, LVt, SVt, SRAM cell PU) and P-type elements (PMOS de-cap capacitor, P-type resistors).

FIGS. 5 to 9 are block diagrams logically illustrating a semiconductor device at various stages of a semiconductor fabrication process, according to an embodiment of the present disclosure. One of ordinary skill in the art will appreciate that these are logical block diagrams used to illustrate device changes resulting from performing acts in a method according to embodiments of the present disclosure, and that other acts or steps are performed before and after those illustrated, as part of the semiconductor fabrication process.

Figure 5:
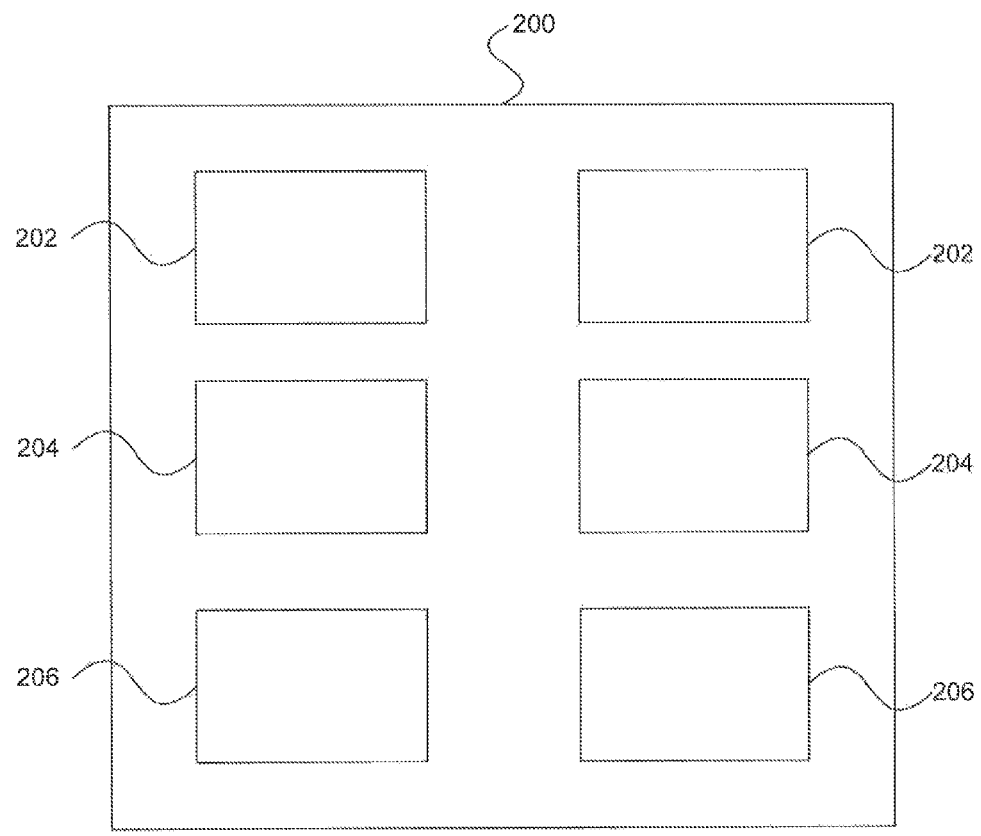
FIGS. 5 to 9 are block diagrams logically illustrating a semiconductor device at various stages of a semiconductor fabrication process, according to an embodiment of the present disclosure.

As shown in the example embodiment of FIG. 5, an electronic device, such as a semiconductor device 200, comprises a plurality of active circuits 202. The device also comprises a first plurality of idle circuits 204 of a first type, such as N-type, and a second plurality of idle circuits 206 of a second type, such as P-type. These circuits 204 and 206 are idle, inactive or unused with respect to a particular product variant in relation to which current leakage reduction is desired. FIG. 5 illustrates the device 202 before the steps 104 and 106 from the method of FIG. 1 are performed. Step 102 may already have been performed at this stage, in order to identify the idle circuits 204 and 206, and in any case the identification results associated with step 102 would be provided before the steps shown in FIG. 6.

Figure 6:
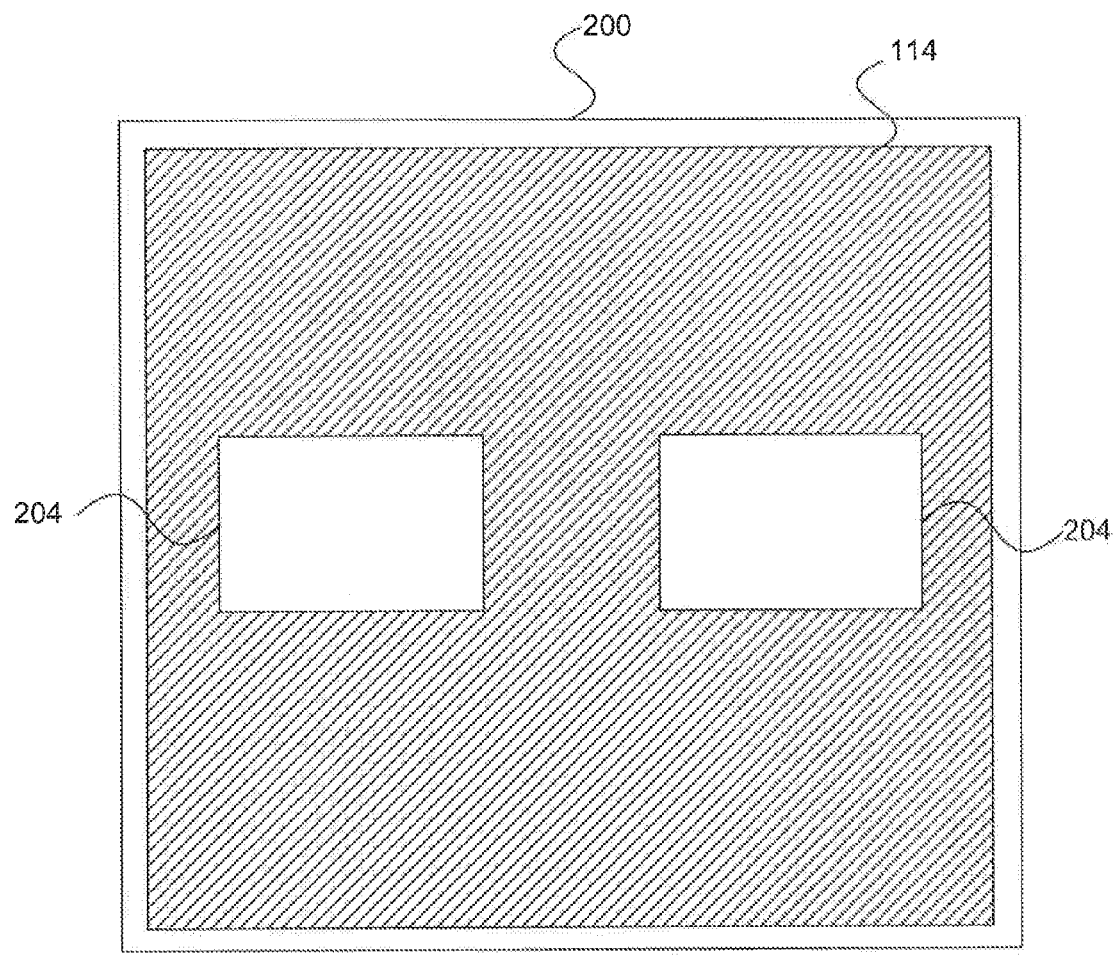

In FIG. 6, step 104 of FIG. 2 is applied such that the device 200 is selectively masked to expose at least one identified idle circuit. In the example embodiment of FIG. 6, a first idle circuit mask 114 is applied to the circuit 200 to expose the first plurality of idle circuits 204 of the first type. After the first mask 114 is applied, as shown in FIG. 6, step 106 is performed such that a characteristic of the first plurality of idle circuits 204 is modified, to inhibit the first plurality of idle circuits and reduce current leakage therefrom.

Figure 7:
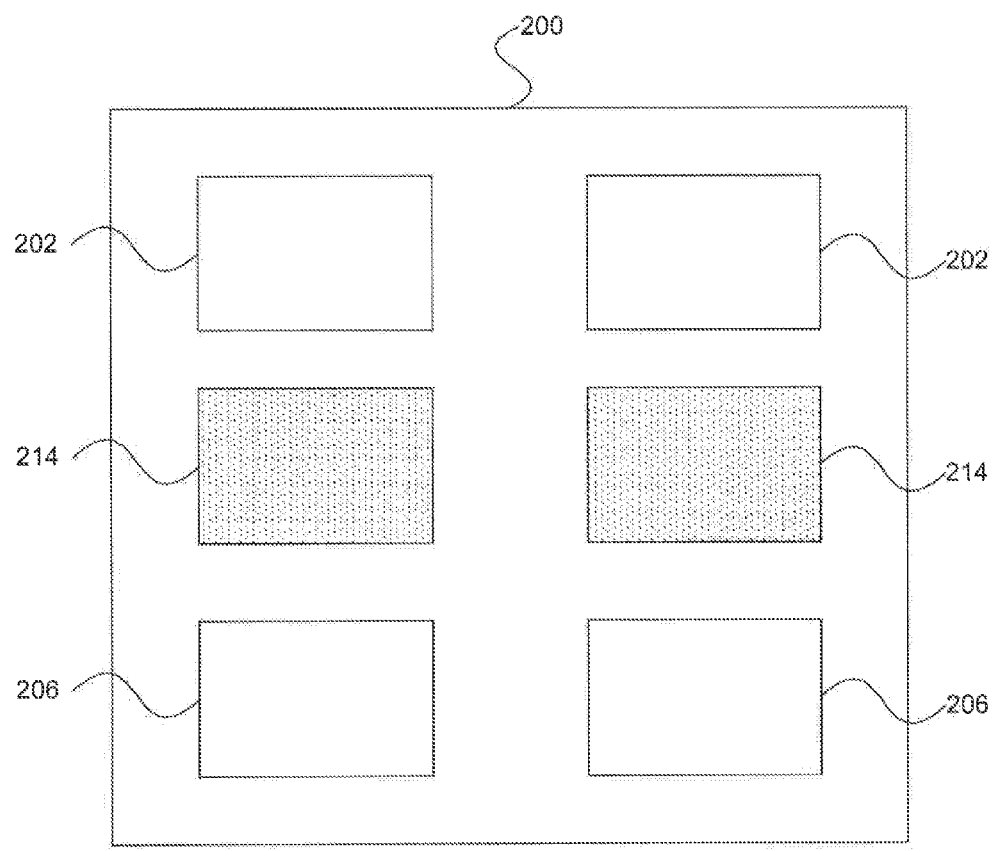

FIG. 7 illustrates the results, or effects, on the device 200 of step 106 having been performed. The first plurality of idle circuits have been modified to produce a first plurality of inhibited circuits 214, as shown in FIG. 7.

Figure 8:
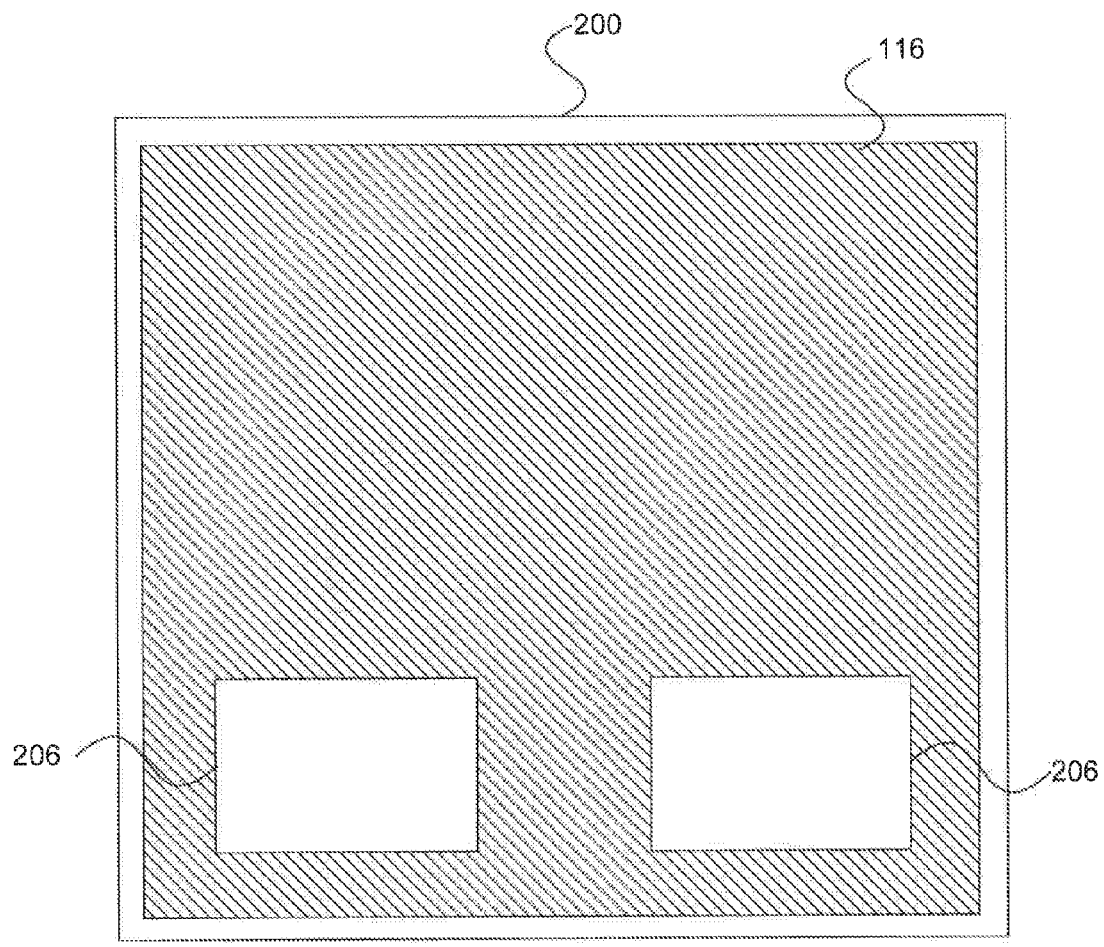
Figure 9:
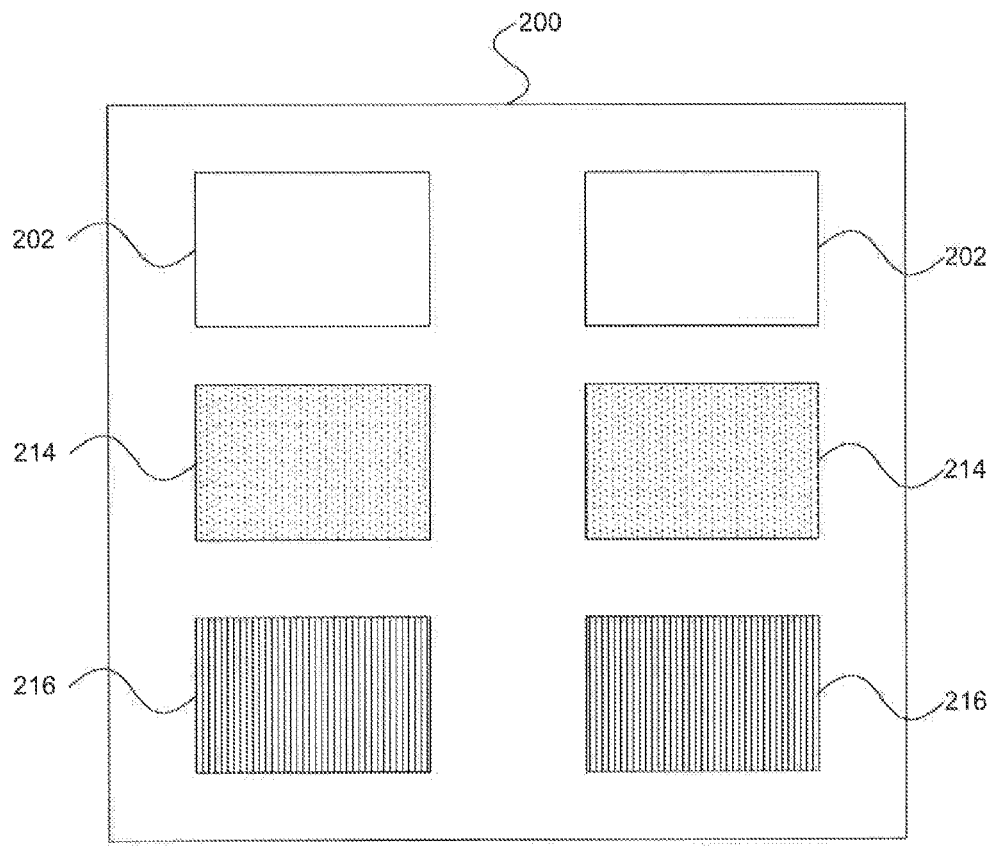

FIG. 8 and FIG. 9 further illustrate an example embodiment in which a second mask is applied. In FIG. 8, step 104 of FIG. 2 is applied a second time such that a second idle circuit mask 116 is applied to the circuit 200 to expose the second plurality of idle circuits 206 of the second type. After the second mask 116 is applied, as shown in FIG. 8, step 106 is again performed such that a characteristic of the second plurality of idle circuits 206 is modified, to inhibit the second plurality of idle circuits and reduce current leakage therefrom.

FIG. 9 illustrates the results, or effects, on the device 200 of step 106 having been performed on both the first and second plurality of idle circuits. The second plurality of idle circuits have been modified to produce a second plurality of inhibited circuits 216, in addition to the first plurality of inhibited circuits 214.

Accordingly, in an embodiment, the present disclosure provides a semiconductor device, comprising: at least one active circuit; and at least one inhibited circuit having reduced current leakage, the at least one inhibited circuit having been identified as idle with respect to a product variant and having undergone modification of a circuit characteristic during fabrication to generate the at least one inhibited circuit from at least one identified idle circuit.

In an example embodiment, the at least one inhibited circuit comprises first and second pluralities of inhibited circuits having reduced current leakage. The first plurality of inhibited circuits is of a first type and was identified as idle with respect to a product variant and underwent modification of a circuit characteristic during fabrication to generate the first plurality of inhibited circuits from at least one identified idle circuit of the first type. The second plurality of inhibited circuits is of a second type and was identified as idle with respect to the product variant and underwent separate modification of a circuit characteristic during fabrication to generate the second plurality of inhibited circuits from at least one identified idle circuit of the second type.

Information as herein shown and described in detail is fully capable of attaining the above-described object of the disclosure. Any presently preferred embodiment(s) of is/are, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, and fabrication material detail may be made, without departing from the spirit and scope of the disclosure as set forth in the appended claims, should be readily apparent to those of ordinary skill in the art. No claim herein is to be construed under the provisions of 35 U.S.C. §112, sixth paragraph, unless the element is expressly recited using the phrase "means for."

What is claimed is:

1. A method of fabricating a semiconductor device for reducing current leakage therein, the method comprising:
   obtaining a design for fabricating the semiconductor device, the design comprising active circuits and one or more unused circuits, wherein obtaining comprises:
      identifying, by a processor, at least one of the one or more unused circuits in the obtained design of the semiconductor device based on a set of timing constraints by:
         applying a subtractive unused circuit identification;
         analyzing static timing of all active circuits for determining a first circuit list including at least one timing-constrained circuit having a timing-constrained path;
         generating a second circuit list of at least one non-timing-constrained circuit by omitting circuits in the first circuit list from a list of all circuits; and
         identifying, in the second circuit list, the at least one of the one or more unused circuits in the device by omitting, from the second circuit list, circuits remaining in operation in the semiconductor device;
   fabricating the semiconductor device based on the obtained design;
   during fabrication:
      selectively masking the semiconductor device to expose the at least one of the one or more unused circuits; and
      modifying a characteristic of each exposed unused circuit to inhibit the each exposed unused circuit and to reduce current leakage therefrom.

2. The method of claim 1, wherein the design comprises a plurality of unused circuits each having the same device type, and
   wherein selectively masking the semiconductor device comprises masking the plurality of unused circuits of the same device type with a circuit mask distinctive to the device type.

3. The method of claim 1, wherein the design comprises a plurality of unused circuits, and the plurality of unused circuits comprises a first set of unused circuits of a first device type and a second set of unused circuits of a second device type, and wherein selectively masking comprises:
masking the first set of unused circuits with a first circuit mask; and
masking the second set of unused circuits with a second circuit mask;
the first and second unused circuit masks being distinctive to the first and second device type, respectively.

4. The method of claim 1, wherein the design comprises a plurality of unused circuits, the plurality of unused circuits comprises a plurality of analog circuits, and selectively masking the semiconductor device comprises selectively masking the plurality of analog circuits.

5. The method of claim 1, wherein the design comprises a plurality of unused circuits, the plurality of unused circuits comprises a plurality of digital circuits, and selectively masking the semiconductor device comprises selectively masking the plurality of digital circuits.

6. The method of claim 1, wherein modifying the characteristic of the each exposed unused circuit comprises:
modifying an electrical characteristic of each exposed unused circuit, resulting in each exposed unused circuit having modified electrical properties.

7. The method of claim 1, wherein modifying the characteristic of each exposed unused circuit comprises:
modifying a physical characteristic of each exposed unused circuit, resulting in each exposed unused circuit having modified electrical properties.

8. The method of claim 1, wherein modifying the characteristic of each exposed unused circuit comprises implanting a dopant.

9. The method of claim 8, wherein implanting the dopant comprises implanting at least one custom dopant.

10. The method of claim 9, wherein the at least one custom dopant comprises at least one of: a voltage threshold (Vt) implant, a pocket implant, a lightly doped drain (LDD) implant, and a source and drain implant.

11. The method of claim 1, wherein modifying the characteristic of each exposed unused circuit comprises at least one of: modifying a gate dielectric thickness; and modifying a gate length.

12. The method of claim 11 wherein modifying the characteristic of each exposed unused circuit comprises modifying a gate length, and wherein modifying a gate length comprises:
at least one of modifying a poly critical dimension (CD), modifying a gate spacer dimension, and modifying a FinFET fin width.

13. The method of claim 1, wherein identifying comprises identifying the at least one of the one or more unused circuits in the obtained design of the semiconductor device based on a set of timing constraints.

14. The method of claim 1, wherein analyzing comprises scanning the at least one timing-constrained circuit with a DC scanning technique.

15. The method of claim 1, wherein analyzing comprises analyzing static timing of all active circuits using a set of timing constraints for the semiconductor device, thereby providing static timing circuit data including data relating to the at least one timing-constrained circuit.

16. The method of claim 15, further comprising:
reanalyzing static timing of all active circuits; and
performing, utilizing a processor, at least one of a circuit level simulation and a gate level timing simulation for confirming that the semiconductor device, fabricated based on the obtained design, is fully functional.

17. The method of claim 1, wherein identifying includes applying a marker layer for tagging the at least one identified unused circuit.

18. The method of claim 1, further comprising preparing a new set of timing models for all types of circuits that are identified as unused circuits.

19. The method of claim 1, further comprising:
selecting an exception circuit from the at least one identified unused circuit; and
maintaining power to the exception circuit, providing the exception circuit with a minimized current leakage, and rendering the exception circuit operable at a minimized speed.

20. A semiconductor device fabricated by a method comprising:
obtaining a design for fabricating the semiconductor device, the design comprising active circuits and one or more unused circuits, wherein obtaining comprises:
identifying, by a processor, at least one of the one or more unused circuits in the obtained design of the semiconductor device based on a set of timing constraints by:
applying a subtractive unused circuit identification;
analyzing static timing of all active circuits for determining a first circuit list including at least one timing-constrained circuit having a timing-constrained path;
generating a second circuit list of at least one non-timing-constrained circuit by omitting circuits in the first circuit list from a list of all circuits; and
identifying, in the second circuit list, the at least one of the one or more unused circuits in the device by omitting, from the second circuit list, circuits remaining in operation in the semiconductor device;
fabricating the semiconductor device based on the obtained design;
during fabrication:
selectively masking the semiconductor device to expose the at least one of the one or more unused circuits; and
modifying a characteristic of each exposed unused circuit to inhibit each exposed unused circuit and to reduce current leakage therefrom.

21. A semiconductor device fabricated by a method comprising:
obtaining a design for fabricating the semiconductor device, the design comprising active circuits and a plurality of unused circuits, and the plurality of unused circuits comprises a first set of unused circuits of a first device type and a second set of unused circuits of a second device type, wherein obtaining comprises:
identifying, by a processor, at least one of the one or more unused circuits in the obtained design of the semiconductor device based on a set of timing constraints by:
applying a subtractive unused circuit identification;
analyzing static timing of all active circuits for determining a first circuit list including at least one timing-constrained circuit having a timing-constrained path;
generating a second circuit list of at least one non-timing-constrained circuit by omitting circuits in the first circuit list from a list of all circuits; and
identifying, in the second circuit list, the at least one of the one or more unused circuits in the device by omitting, from the second circuit list, circuits remaining in operation in the semiconductor device;

fabricating the semiconductor device based on the obtained design;

during fabrication:
- selectively masking the semiconductor device to expose the at least one of the one or more unused circuits, wherein selectively masking comprises:
  - masking the first set of unused circuits with a first circuit mask; and
  - masking the second set of unused circuits with a second circuit mask;
- the first and second unused circuit masks being distinctive to the first and second device type, respectively; and
- modifying a characteristic of each exposed unused circuit to inhibit each exposed unused circuit and to reduce current leakage therefrom.

* * * * *